(12) United States Patent
Bi et al.

(10) Patent No.: US 10,749,011 B2
(45) Date of Patent: Aug. 18, 2020

(54) AREA SELECTIVE CYCLIC DEPOSITION FOR VFET TOP SPACER

(71) Applicant: International Business Machines Corporation, Armonk, NY (US)

(72) Inventors: Zhenxing Bi, Schenectady, NY (US); Kangguo Cheng, Schenectady, NY (US); Yongan Xu, Niskayuna, NY (US); Yi Song, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/169,388

(22) Filed: Oct. 24, 2018

(65) Prior Publication Data

US 2020/0135893 A1    Apr. 30, 2020

(51) Int. Cl.
| | |
|---|---|
| *H01L 21/82* | (2006.01) |
| *H01L 29/66* | (2006.01) |
| *H01L 21/02* | (2006.01) |
| *H01L 29/78* | (2006.01) |
| *H01L 21/762* | (2006.01) |
| *H01L 21/768* | (2006.01) |

(Continued)

(52) U.S. Cl.
CPC .... *H01L 29/66553* (2013.01); *H01L 21/0228* (2013.01); *H01L 21/762* (2013.01); *H01L 21/76832* (2013.01); *H01L 29/0649* (2013.01); *H01L 29/517* (2013.01); *H01L 29/66666* (2013.01); *H01L 29/7827* (2013.01)

(58) Field of Classification Search
CPC combination set(s) only.
See application file for complete search history.

(56) References Cited

U.S. PATENT DOCUMENTS

| | | | |
|---|---|---|---|
| 8,461,634 B2 | 6/2013 | Yang et al. | |
| 8,673,738 B2 | 3/2014 | Doris et al. | |
| 9,627,511 B1 | 4/2017 | Cheng et al. | |

(Continued)

OTHER PUBLICATIONS

Angel Yanguas-Gil et al., "Modulation of the Growth Per Cycle in Atomic Layer Deposition Using Reversible Surface Functionalization," Chemistry of Materials, vol. 25, No. 24, 2013, pp. 4849-4860.

(Continued)

*Primary Examiner* — Moin M Rahman
(74) *Attorney, Agent, or Firm* — Cantor Colburn LLP; Vazken Alexanian

(57) ABSTRACT

Embodiments of the present invention are directed to techniques for forming a vertical field effect transistor (VFET) top spacer using an area selective cyclic deposition. In a non-limiting embodiment of the invention, a first semiconductor fin is formed over a substrate. A second semiconductor fin is formed over the substrate and adjacent to the first semiconductor fin. A dielectric isolation region is formed between the first semiconductor fin and the second semiconductor fin. A top spacer is formed between the first semiconductor fin and the second semiconductor fin by cyclically depositing dielectric layers over the dielectric isolation region. The dielectric layers are inhibited from depositing on a surface of the first semiconductor fin and on a surface of the second semiconductor fin during the cyclic deposition process.

15 Claims, 13 Drawing Sheets

(51) Int. Cl.
    *H01L 29/51*         (2006.01)
    *H01L 29/06*         (2006.01)

(56) References Cited

U.S. PATENT DOCUMENTS

| | | |
|---|---|---|
| 9,741,626 B1 | 8/2017 | Cheng et al. |
| 9,859,388 B1 | 1/2018 | Cheng et al. |
| 9,899,515 B1 | 2/2018 | Cheng et al. |
| 2014/0273425 A1* | 9/2014 | Jamison ............ H01L 21/02186 |
| | | 438/591 |
| 2018/0012752 A1 | 1/2018 | Tapily |
| 2018/0151346 A1 | 5/2018 | Blanquart |
| 2019/0035938 A1* | 1/2019 | Park .................... H01L 29/7827 |
| 2019/0067474 A1* | 2/2019 | Wong .................. H01L 29/7827 |
| 2019/0139836 A1* | 5/2019 | Chu .................. H01L 21/02532 |
| 2019/0319112 A1* | 10/2019 | Zang ................. H01L 29/66545 |

OTHER PUBLICATIONS

Fatemeh Sadat Minaye Hashemi et al., "Selective Deposition of Dielectrics: Limits and Advantages of Alkanethiol Blocking Agents on Metal—Dielectric Patterns," ACS Applied Materials & Interfaces, vol. 8, No. 48, 2016, pp. 33264-33272.

\* cited by examiner

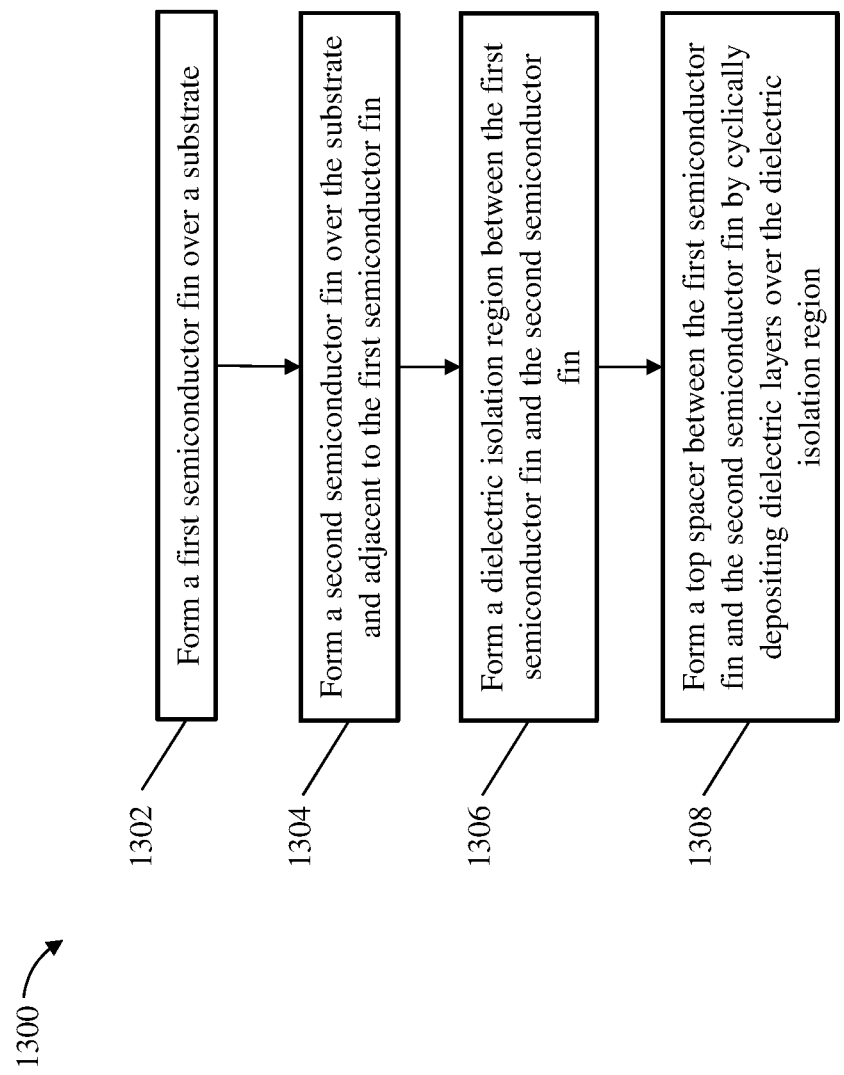

AREA SELECTIVE CYCLIC DEPOSITION FOR VFET TOP SPACER

BACKGROUND

The present invention generally relates to fabrication methods and resulting structures for semiconductor devices, and more specifically, to fabrication methods and resulting structures for an area selective cyclic deposition for a vertical field effect transistor (VFET) top spacer.

Traditional metal oxide semiconductor field effect transistor (MOSFET) fabrication techniques include process flows for constructing planar field effect transistors (FETs). A planar FET includes a substrate (also referred to as a silicon slab), a gate formed over the substrate, source and drain regions formed on opposite ends of the gate, and a channel region near the surface of the substrate under the gate. The channel region electrically connects the source region to the drain region while the gate controls the current in the channel. The gate voltage controls whether the path from drain to source is an open circuit ("off") or a resistive path ("on").

In recent years, research has been devoted to the development of nonplanar transistor architectures. Some non-planar transistor device architectures, such as VFETs, employ semiconductor fins and side-gates that can be contacted outside the active region, resulting in increased device density and some increased performance over lateral devices. In contrast to planar FETs, the source to drain current in a VFET flows through the vertical fin in a direction that is perpendicular with respect to a horizontal major surface of the wafer or substrate. A VFET can achieve a smaller device footprint because its channel length is decoupled from the contacted gate pitch.

SUMMARY

Embodiments of the invention are directed to a method for forming a vertical field effect transistor (VFET) top spacer using an area selective cyclic deposition. A non-limiting example of the method includes forming a first semiconductor fin over a substrate. A second semiconductor fin is formed over the substrate and adjacent to the first semiconductor fin. A dielectric isolation region is formed between the first semiconductor fin and the second semiconductor fin. A top spacer is formed between the first semiconductor fin and the second semiconductor fin by cyclically depositing dielectric layers over the dielectric isolation region. The dielectric layers are inhibited from depositing on a surface of the first semiconductor fin and on a surface of the second semiconductor fin during the cyclic deposition process.

Embodiments of the invention are directed to a method for forming a vertical field effect transistor (VFET) top spacer using an area selective cyclic deposition. A non-limiting example of the method includes forming a first semiconductor fin over a substrate. A second semiconductor fin is formed over the substrate and adjacent to the first semiconductor fin. A conductive gate is formed over a channel region of the first semiconductor fin and over a channel region of the second semiconductor fin. A dielectric isolation region is formed between the first semiconductor fin and the second semiconductor fin. The dielectric isolation region is formed between opposite sidewalls of the conductive gate. A dielectric material is selectively deposited on a surface of the dielectric isolation region.

Embodiments of the invention are directed to a vertical field effect transistor (VFET) top spacer formed using an area selective cyclic deposition. A non-limiting example of the semiconductor device includes a first semiconductor fin over a substrate. The device further includes a second semiconductor fin over the substrate and adjacent to the first semiconductor fin. The device further includes a dielectric isolation region between the first semiconductor fin and the second semiconductor fin. The device further includes a top spacer between the first semiconductor fin and the second semiconductor fin. The top spacer includes cyclically deposited dielectric layers.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 13 depicts a flow diagram illustrating a method according to one or more embodiments of the invention.

Figure 1:
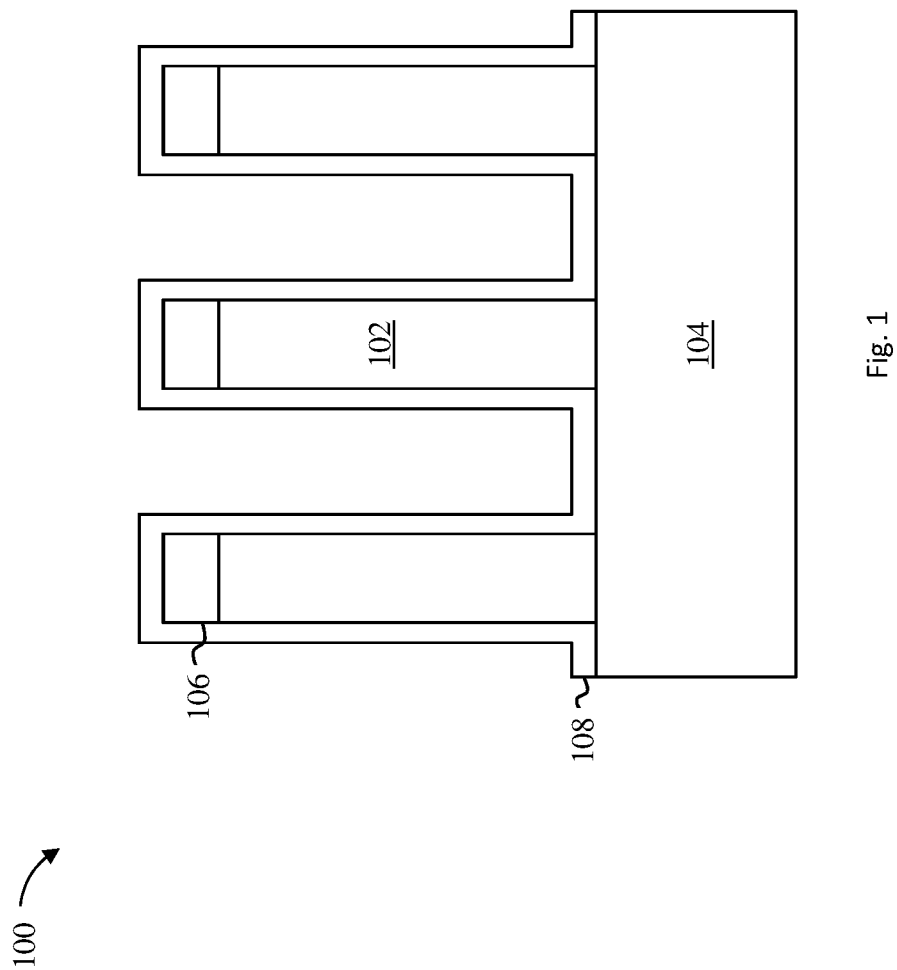
FIG. 1 depicts a cross-sectional view of a semiconductor structure after initial processing operations according to one or more embodiments of the invention.

The diagrams depicted herein are illustrative. There can be many variations to the diagram or the operations described therein without departing from the spirit of the invention. For instance, the actions can be performed in a differing order or actions can be added, deleted or modified.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

It is understood in advance that although example embodiments of the invention are described in connection with a particular transistor architecture, embodiments of the invention are not limited to the particular transistor architectures or materials described in this specification. Rather, embodiments of the present invention are capable of being implemented in conjunction with any other type of transistor architecture or materials now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, a metal-oxide-semiconductor field-effect transistor (MOSFET) is used for amplifying or switching electronic signals. The MOSFET has a source, a drain, and a metal oxide gate electrode. The metal gate portion of the metal oxide gate electrode is electrically insulated from the main semiconductor n-channel or p-channel by the oxide portion of the metal oxide gate electrode. The oxide portion of the gate electrode can be implemented as a thin layer of insulating material, for example, silicon dioxide or glass, which makes the input resistance of the MOSFET relatively high. The gate voltage controls whether the current path from the source to the drain is an open circuit ("off") or a resistive path ("on"). N-type field effect transistors (NFET) and p-type field effect transistors (PFET) are two types of complementary MOSFETs. The NFET includes n-doped source and drain junctions and uses electrons as the current carriers. The PFET includes p-doped source and drain junctions and uses holes as the current carriers.

To increase transistor densities, some device manufacturers have developed non-planar transistor architectures. In vertical field effect transistors (VFETs), for example, the source to drain current flows in a direction that is perpendicular to a major surface of the substrate. For example, in a known VFET configuration a major substrate surface is horizontal, and a vertical fin or nanowire extends upward from the substrate surface. The fin or nanowire forms the channel region of the transistor. A source region and a drain region are situated in electrical contact with the top and bottom ends of the channel region, while the gate is disposed on one or more of the fin or nanowire sidewalls.

While VFET architectures have enabled smaller device footprints, there are challenges to providing VFETs with equal or superior performance characteristics to lateral devices. The conventional VFET top spacer fabrication process, for example, is limited by a low thermal budget but requires a high-quality dielectric. The top spacer material must provide a relatively high etch resistance to sustain downstream epi-preclean and spacer RIE processes. Moreover, conventional top spacer fabrication processes are prone to forming a void or seam during the top spacer divot fill. These top spacer voids or seams limit the subsequent RIE process window.

Turning now to an overview of aspects of the present invention, one or more embodiments of the invention address the above-described shortcomings of the prior art by providing fabrication methods and resulting structures for providing an area selective cyclic deposition for a VFET top spacer. The area selective cyclic deposition scheme described herein is leveraged during the VFET top spacer divot filling step to provide a high-quality top spacer without voids or seams. Advantageously, selective spacer material deposition only occurs on isolation or dielectric surfaces. In other words, the area selective cyclic deposition scheme does not result in spacer material deposition on exposed surfaces of the semiconductor fin, high-k dielectric, or gate. By avoiding voids and seams, this improved top spacer divot fill provides improved etch resistance to downstream processes. Importantly, the area selective cyclic deposition described herein is a low temperature process (i.e., accomplished at a temperature of less than or equal to about 400 degrees Celsius) compatible with the conventional VFET thermal budget.

Turning now to a more detailed description of aspects of the present invention, FIG. 1 depicts a cross-sectional view of a partially fabricated semiconductor structure 100 after an initial set of fabrication operations have been performed in accordance with embodiments of the invention. As depicted in FIG. 1, the partially fabricated semiconductor structure 100 can include one or more semiconductor fins 102 formed on a substrate 104.

The semiconductor fins 102 can be formed on the substrate 104 using known front-end-of-line (FEOL) finFET fabrication techniques. For example, in some embodiments of the invention, a patterned hard mask 106 is etched to expose portions of the substrate 104. The exposed portions of the substrate 104 can then be recessed to form a plurality of semiconductor fins. The exposed portions of the substrate 104 can be removed using an etch process, which can be a wet etch process, a dry etch process or a combination thereof. In some embodiments of the invention, the hard mask 106 includes a nitride, such as silicon nitride. In some embodiments of the invention, the hard mask 106 is formed to a thickness of 40 nm, although other thicknesses are within the contemplated scope of the invention.

The semiconductor fins 102 can each have a height ranging from 4 nm to 150 nm. In some embodiments of the present invention, the semiconductor fins 102 are formed to a height of about 20 nm. Each of the fins can have a width ranging from 5 nm to 50 nm. The fins can be separated by a pitch ranging from 10 nm to 100 nm. The semiconductor fins 102 can be doped with n-type dopants (e.g., As, P, Sb) or p-type dopants (e.g., B, $BF_2$, Al, Ga) to form nFET semiconductor fins and pFET semiconductor fins, as desired. The dopant concentration can range from $1\times10^{19}$ $cm^{-3}$ to $2\times10^{21}$ $cm^{-3}$, or between $1\times10^{20}$ $cm^{-3}$ and $1\times10^{21}$ $cm^{-3}$. In some embodiments of the invention, the semiconductor fins 102 are epitaxially grown on the substrate 104.

The semiconductor fins 102 can be made of any suitable material, such as, for example, Si, SiGe, Group II-IV compound semiconductor, Group III-V compound semiconductor, or other suitable materials. Group III-V compound semiconductors include materials having at least one group III element and at least one group V element, such as, for example, one or more of aluminum gallium arsenide (AlGaAs), aluminum gallium nitride (AlGaN), aluminum arsenide (AlAs), aluminum indium arsenide (AlIAs), aluminum nitride (AlN), gallium antimonide (GaSb), gallium aluminum antimonide (GaAlSb), gallium arsenide (GaAs), gallium arsenide antimonide (GaAsSb), gallium nitride (GaN), indium antimonide (InSb), indium arsenide (InAs), indium gallium arsenide (InGaAs), indium gallium arsenide phosphide (InGaAsP), indium gallium nitride (InGaN), indium nitride (InN), indium phosphide (InP) and alloy combinations including at least one of the foregoing materials. The alloy combinations can include binary (two elements, e.g., gallium (III) arsenide (GaAs)), ternary (three elements, e.g., InGaAs) and quaternary (four elements, e.g., aluminum gallium indium phosphide (AlInGaP)) alloys.

The substrate 104 can be made of any suitable substrate material, such as, for example, Si, SiGe, SiC, Group III-V compound semiconductor, Group II-VI compound semiconductor, or semiconductor-on-insulator (SOI). For example, in embodiments where the semiconductor fins 102 are made of InGaAs, the substrate 104 can be made of InP. In some embodiments of the invention, the substrate 104 includes a buried oxide layer (not depicted). The buried oxide layer can be made of any suitable dielectric material, such as, for example, a silicon oxide. In some embodiments of the invention, the buried oxide layer is formed to a thickness of about 145 nm, although other thicknesses are within the contemplated scope of the invention. In some embodiments of the invention, the semiconductor structure 100 can be electrically isolated from other regions of the substrate 104 by a shallow trench isolation region (not depicted).

As depicted in FIG. 1, a dielectric liner 108 has been formed over a surface of the substrate 104 and the hard mask 106. In some embodiments of the invention, the dielectric liner 108 is formed using a chemical vapor deposition (CVD), plasma-enhanced CVD (PECVD), ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), atomic layer deposition (ALD), physical vapor deposition (PVD), chemical solution deposition, or other like process. In some embodiments of the invention, dielectric material can be conformally deposited over the semiconductor structure 100 using, for example, CVD or ALD. The dielectric liner 108 can be made of any suitable material, such as, for example, a low-k dielectric, a nitride, silicon nitride, silicon oxide, SiON, SiC, SiOCN, or SiBCN. In some embodiments of the invention, the dielectric liner 108 is made of SiN. The dielectric liner 108 can be formed to a thickness of about 5 to 10 nm, although other thicknesses are within the contemplated scope of the invention.

Figure 2:
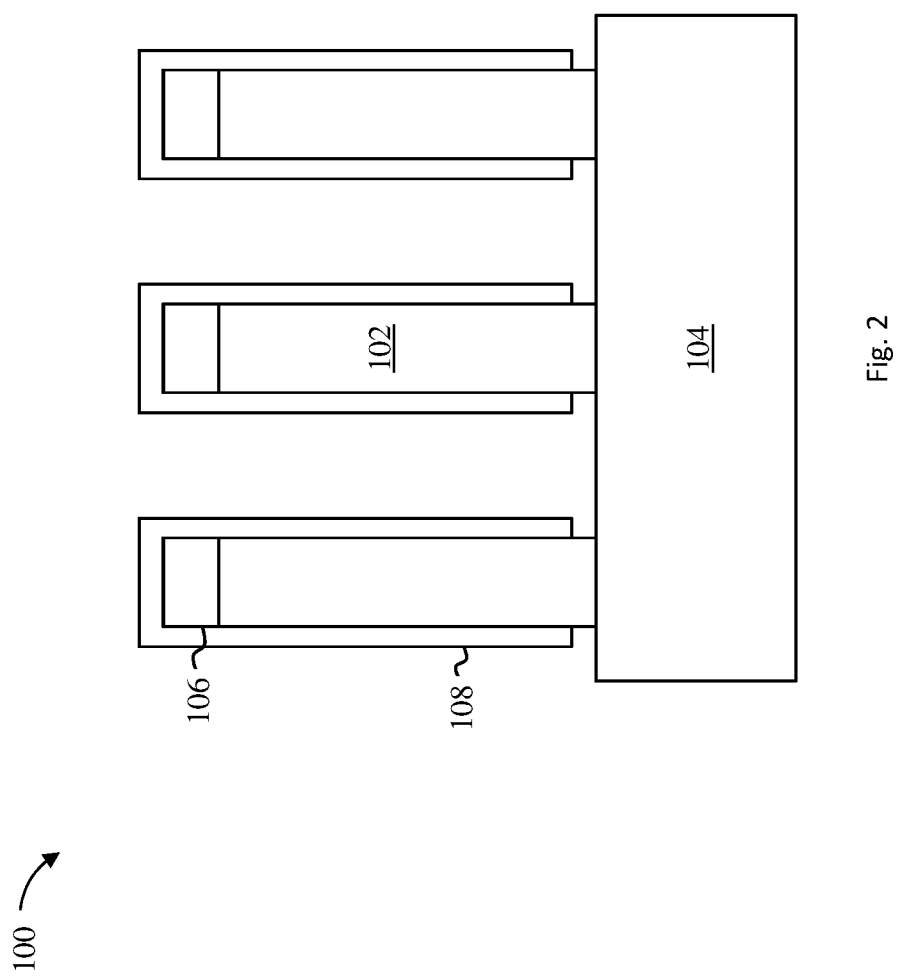
FIG. 2 depicts a cross-sectional view of the semiconductor structure after one or more processing operations according to one or more embodiments of the invention.

In FIG. 2, known semiconductor fabrication operations have been used to remove a portion of the dielectric liner 108 to expose a sidewall of the semiconductor fins 102. The dielectric liner 108 can be partially removed using a wet etch, a dry etch, or a combination of sequential wet and/or dry etches. In some embodiments of the invention, portions of the dielectric liner 108 are removed using a directional RIE. In some embodiments of the invention, portions of the dielectric liner 108 are removed such that the semiconductor fins 102 include sidewalls having an exposed length of 4 nm to 20 nm, although other lengths are within the contemplated scope of aspects of the invention.

Figure 3:
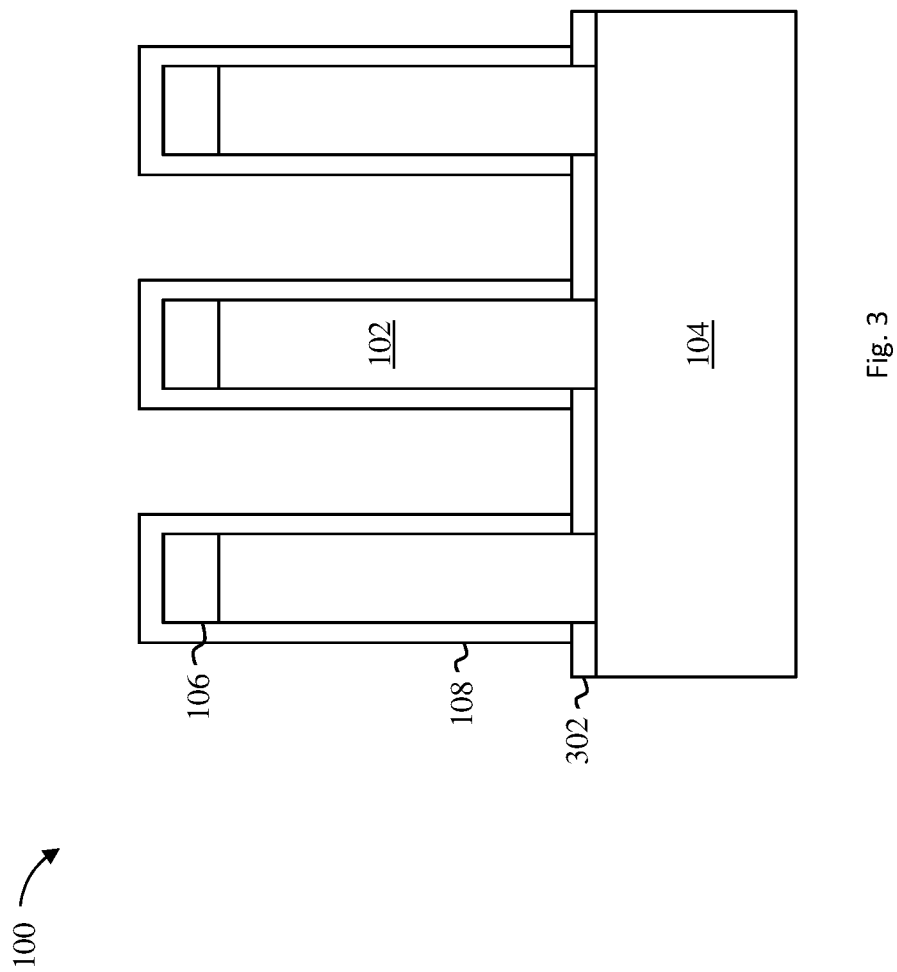
FIG. 3 depicts a cross-sectional view of the semiconductor structure after one or more processing operations according to one or more embodiments of the invention.

FIG. 3 depicts a cross-sectional view of the semiconductor structure 100 during an intermediate operation of a method of fabricating a semiconductor device according to one or more embodiments of the invention. As illustrated in FIG. 3, a bottom junction source/drain epitaxy 302 (hereinafter bottom junction 302) is formed over the surface of the substrate 104 and adjacent to the exposed sidewalls of the semiconductor fins 102. In this manner, the length of the exposed sidewalls of the semiconductor fins 102 (as illustrated in FIG. 2) defines the final thickness of the bottom junction 302. In some embodiments of the invention, the bottom junction 302 is epitaxially grown to a thickness of about 4 nm to about 20 nm, for example 10 nm, although other thicknesses are within the contemplated scope of the invention.

In some embodiments of the invention, the bottom junction 302 can be epitaxially grown on exposed surfaces of the substrate 104 and the exposed sidewalls of the semiconductor fins 102. The terms "epitaxial growth and/or deposition" and "epitaxially formed and/or grown" refer to the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments of the invention, epitaxial growth and/or deposition processes are selective to forming on semiconductor surface, and generally do not deposit material on other exposed surfaces, such as silicon dioxide or silicon nitride surfaces.

Epitaxial semiconductor materials can be grown using, for example, vapor-phase epitaxy (VPE), molecular beam epitaxy (MBE), liquid-phase epitaxy (LPE), or other suitable processes. The bottom junction 302 can include epitaxial semiconductor materials grown from gaseous or liquid precursors.

In some embodiments of the invention, the gas source for the deposition of epitaxial semiconductor material includes a silicon containing gas source, a germanium containing gas source, or a combination thereof. For example, an epitaxial silicon layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium and argon can be used. In some embodiments of the invention, the epitaxial semiconductor materials include carbon doped silicon (Si:C). This Si:C layer can be grown in the same chamber used for other epitaxy steps or in a dedicated Si:C epitaxy chamber. The Si:C can include carbon in the range of about 0.2 percent to about 3.0 percent.

Epitaxial silicon and silicon germanium can be doped by adding n-type dopants (e.g., phosphorus or arsenic) or p-type dopants (e.g., Ga, B, $BF_2$, or Al). In some embodiments of the invention, the bottom junction 302 can be epitaxially formed and doped by a variety of methods, such as, for example, in-situ doped epitaxy (doped during deposition), doped following the epitaxy, or by implantation and plasma doping. The dopant concentration in the doped regions can range from $1\times10^{19}$ $cm^{-3}$ to $2\times10^{21}$ $cm^{-3}$, or between $1\times10^{20}$ $cm^{-3}$ and $1\times10^{21}$ $cm^{-3}$.

Figure 4:
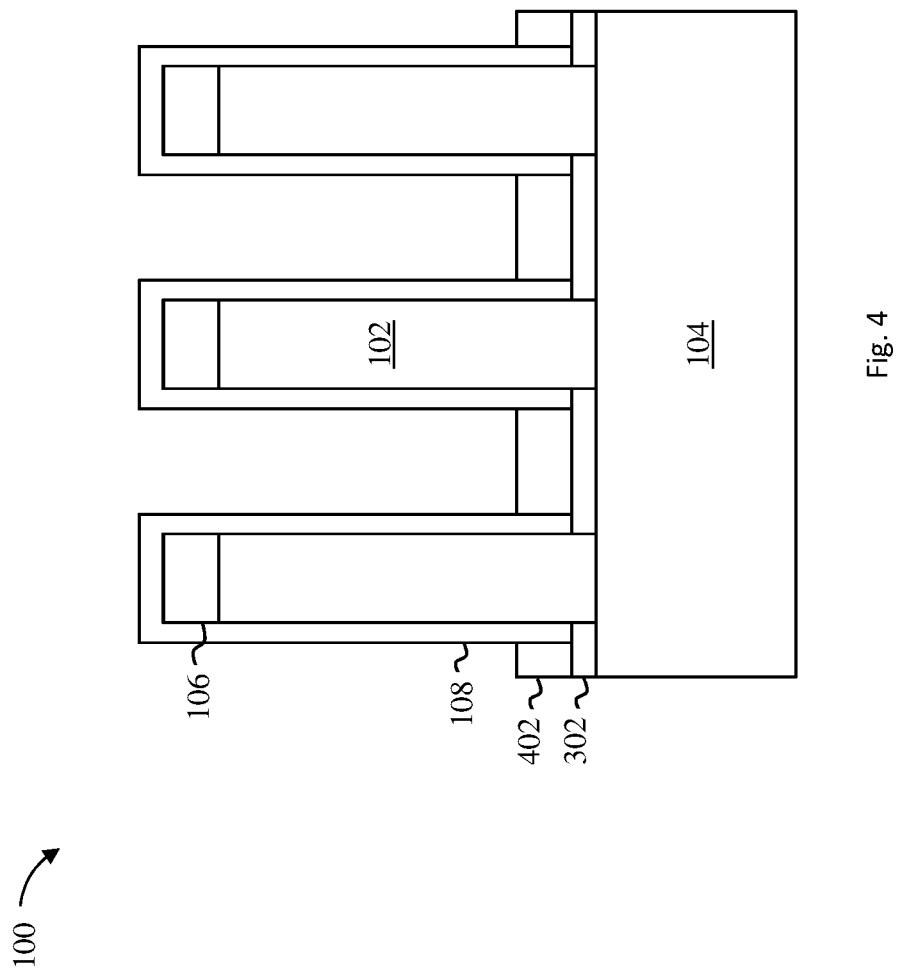
FIG. 4 depicts a cross-sectional view of the semiconductor structure after one or more processing operations according to one or more embodiments of the invention.

FIG. 4 depicts a cross-sectional view of the semiconductor structure 100 during an intermediate operation of a method of fabricating a semiconductor device according to one or more embodiments of the invention. As illustrated in FIG. 4, a bottom spacer 402 can be formed over the bottom junction 302. In some embodiments of the invention, the bottom spacer 402 is formed using a CVD, PECVD, ALD, PVD, chemical solution deposition, or other like processes. For example, spacer material can be directionally deposited over the semiconductor structure 100. The bottom spacer 402 can be made of any suitable material, such as, for example, a low-k dielectric, a nitride, silicon nitride, silicon oxide, SiON, SiC, SiOCN, or SiBCN. The bottom spacer 402 can be formed to a thickness of about 5 to 10 nm, although other thicknesses are within the contemplated scope of the invention.

In some embodiments of the invention, the bottom spacer 402 is formed using a directional deposition process, during which some spacer material is deposited on the sidewalls of the dielectric liner 108 as well as on a top surface of the dielectric liner 108 over the hard mask 106 (not depicted). In some embodiments of the invention, the horizontal thickness of the deposited spacer material (i.e., a thickness deposited over the surface of the bottom junction 302 and the hard mask 106) can be greater than the vertical thickness of the deposited spacer material (i.e., a thickness deposited on the sidewalls of the dielectric liner 108).

Figure 5:
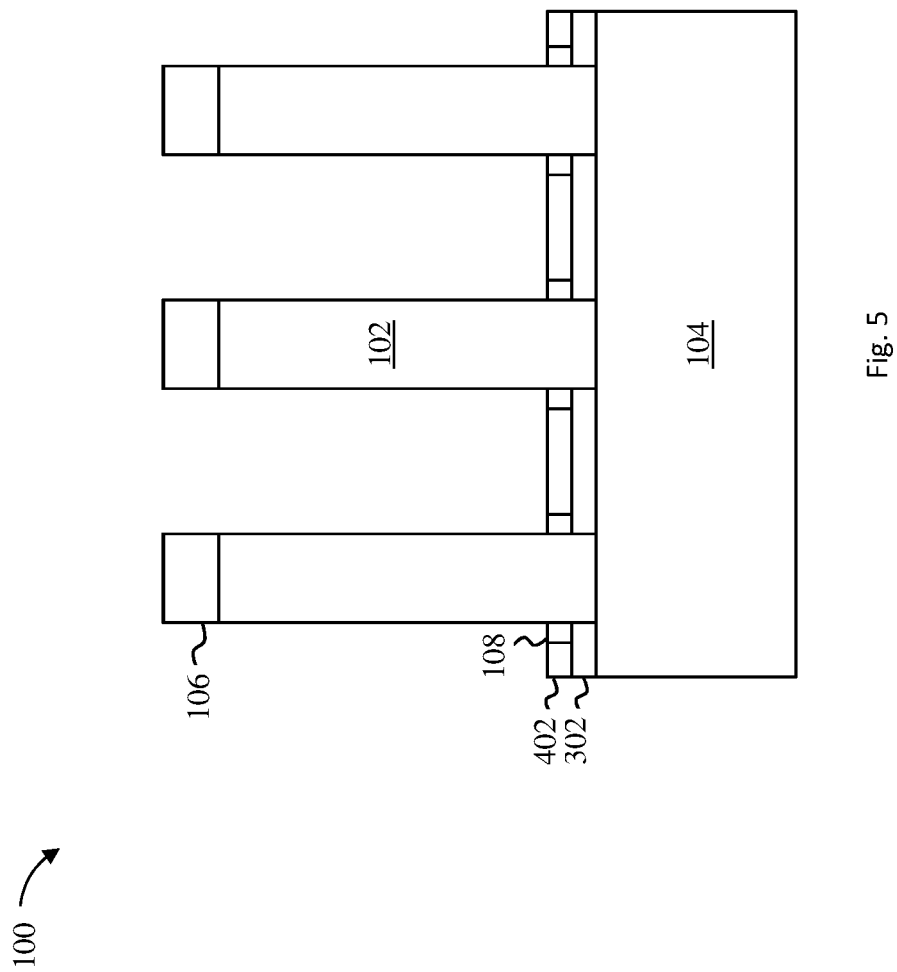
FIG. 5 depicts a cross-sectional view of the semiconductor structure after one or more processing operations according to one or more embodiments of the invention.

FIG. 5 depicts a cross-sectional view of the semiconductor structure 100 during an intermediate operation of a method of fabricating a semiconductor device according to one or more embodiments of the invention. As illustrated in FIG. 5, portions of the bottom spacer 402 and the dielectric liner 108 can be removed to expose sidewalls of the semiconductor fins 102. The bottom spacer 402 and the dielectric liner 108 can be partially removed using a wet etch, a dry etch, or a combination of sequential wet and/or dry etches. In some embodiments of the invention, the bottom spacer 402 and the dielectric liner 108 are isotropically etched during a sidewall spacer etch back. In this manner, the relatively thin portions of dielectric material on the sidewalls of the semiconductor fins 102 (e.g., the bottom spacer 402 and the dielectric liner 108) can be removed while still preserving some thickness of the dielectric material on the horizontal surface (e.g., portions of the bottom spacer 402 and the dielectric liner 108 over the bottom junction 302). In some embodiments of the invention, a thickness of the bottom spacer 402 following the etch back is about 5 nm to about 20 nm, for example 10 nm, although other thicknesses are within the contemplated scope of the invention.

Figure 6:
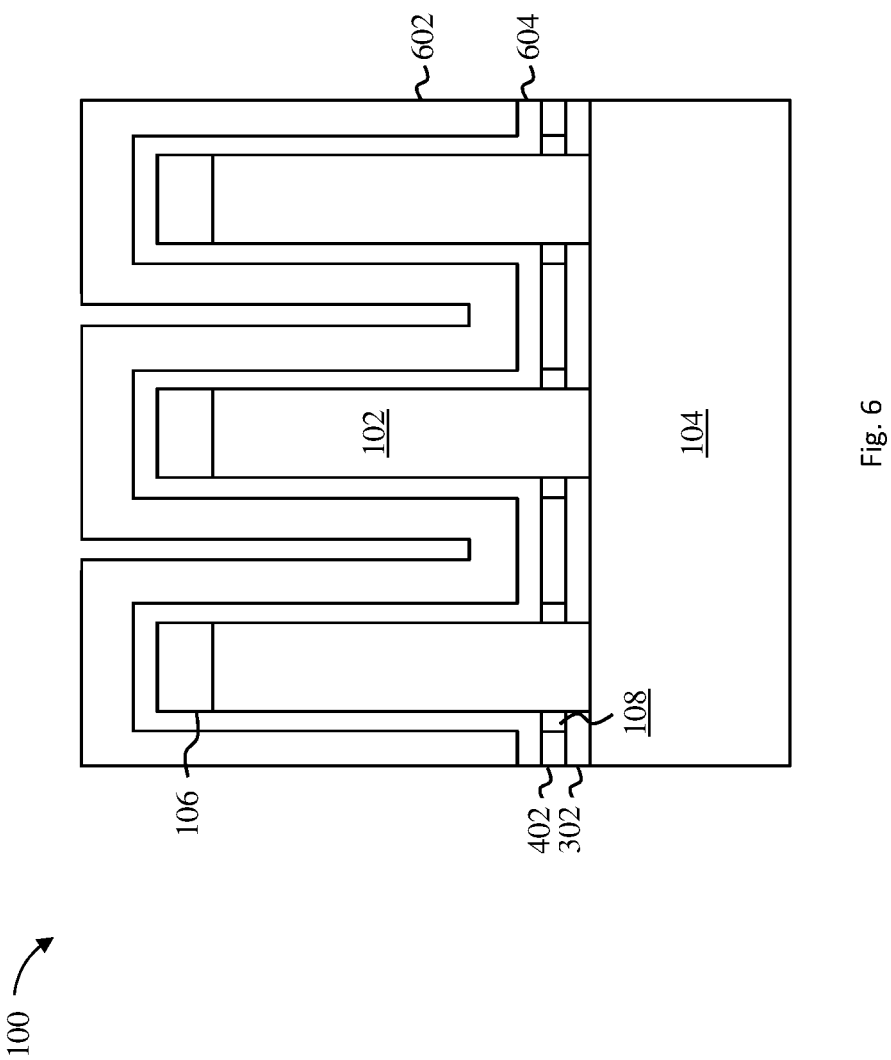
FIG. 6 depicts a cross-sectional view of the semiconductor structure after one or more processing operations according to one or more embodiments of the invention.

FIG. 6 depicts a cross-sectional view of the semiconductor structure 100 during an intermediate operation of a method of fabricating a semiconductor device according to one or more embodiments of the invention. As illustrated in FIG. 6, a gate 602 can be formed over the semiconductor structure 100. The gate 602 can be made of any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), conductive carbon, graphene, or any suitable combination of these materials. The conductive material can further include dopants that are incorporated during or after deposition.

In some embodiments of the invention, the gate 602 is a high-k metal gate (HKMG) and a high-k dielectric film 604 is formed between the gate 602 and the semiconductor fins 102. In some embodiments of the invention, the high-k dielectric film 604 can be used to modify the work function of the gate 602. The high-k dielectric film 604 can include a dielectric material having a dielectric constant greater than or equal to, for example, 3.9, 7.0, or 10.0. Non-limiting examples of suitable materials for the high-k dielectric film 604 include oxides (e.g., silicon oxide), nitrides (e.g., silicon nitride), oxynitrides (e.g., SiON), silicates (e.g., metal silicates), aluminates, titanates, SiBCN, SiOCN, high-k materials, or any combination thereof.

Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum.

The high-k dielectric film 604 can be formed by any suitable deposition processes, for example, CVD, PECVD, ALD, evaporation, PVD, chemical solution deposition, or other like processes. In some embodiments of the invention, the high-k dielectric film 604 is formed by a conformal deposition (e.g., CVD or ALD) over a surface of the semiconductor fins 102. The thickness of the high-k dielectric film 604 can vary depending on the deposition process as well as the composition and number of high-k dielectric materials used. In some embodiments of the invention, the high-k dielectric film 604 can have a thickness of about 0.5 nm to about 4 nm, although other thicknesses are within the contemplated scope of the invention.

In some embodiments of the invention, work function layers (not depicted) are formed between the high-k dielectric film 604 and the gate 602. The work function layers can be made of, for example, aluminum, lanthanum oxide, magnesium oxide, strontium titanate, strontium oxide, titanium nitride, tantalum nitride, hafnium nitride, tungsten nitride, molybdenum nitride, niobium nitride, hafnium silicon nitride, titanium aluminum nitride, tantalum silicon nitride, titanium aluminum carbide, tantalum carbide, and combinations thereof. The work function layer can serve to further modify the work function of the gate 602. The work function layers can be formed to a thickness of about 0.5 to 10 nm, for example, 2 nm, although other thicknesses are within the contemplated scope of the invention.

Figure 7:
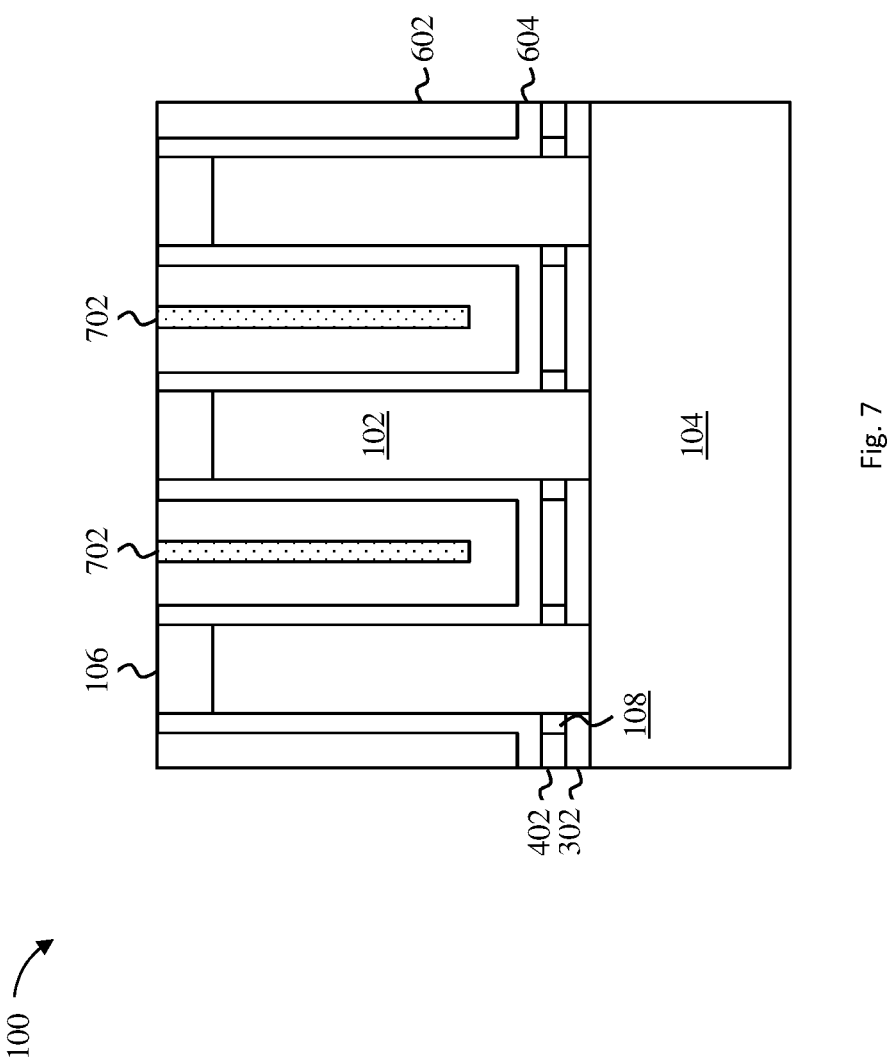
FIG. 7 depicts a cross-sectional view of the semiconductor structure after one or more processing operations according to one or more embodiments of the invention.

FIG. 7 depicts a cross-sectional view of the semiconductor structure 100 during an intermediate operation of a method of fabricating a semiconductor device according to one or more embodiments of the invention. As illustrated in FIG. 7, a dielectric isolation region 702 (sometimes referred to as an interlayer dielectric) can be formed between opposite sidewalls of the high-k dielectric film 604 to fill any remaining spaces between the semiconductor fins 102.

The dielectric isolation region 702 can be made of any suitable dielectric material, such as, for example, porous silicates, carbon doped oxides, silicon dioxides, silicon nitrides, silicon oxynitrides, or other dielectric materials. Any known manner of forming the dielectric isolation region 702 can be utilized, such as, for example, CVD, PECVD, ALD, flowable CVD, spin-on dielectrics, or PVD. In some embodiments of the invention, the dielectric isolation region 702, the gate 602, and the high-k dielectric film 604 are planarized to a top surface of the hard mask 106, using, for example, a chemical-mechanical planarization (CMP) process.

Figure 8:
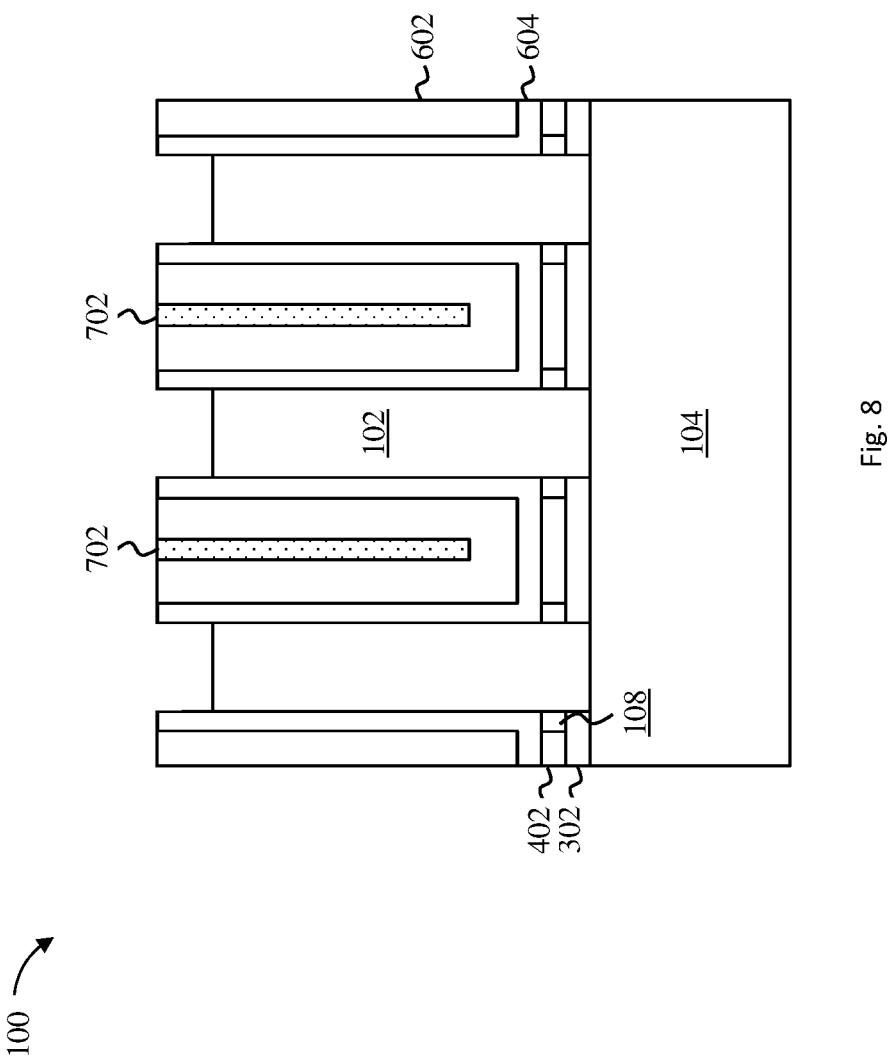
FIG. 8 depicts a cross-sectional view of the semiconductor structure after one or more processing operations according to one or more embodiments of the invention.

FIG. 8 depicts a cross-sectional view of the semiconductor structure 100 during an intermediate operation of a method of fabricating a semiconductor device according to one or more embodiments of the invention. As illustrated in FIG. 8, the hard mask 106 is removed to expose a surface of the semiconductor fins 102. The hard mask 106 can be removed using an etch process, which can be a wet etch process, a dry etch process or a combination thereof. In some embodiments of the invention, the hard mask 106 is removed using known hard mask open (hard mask pull) processes. For example, the hard mask 106 can be removed using a silicon nitride ME. In some embodiments of the invention, the hard mask 106 is removed using a ME selective to the gate 602, the high-k dielectric film 604, and/or the semiconductor fins 102.

Figure 9:
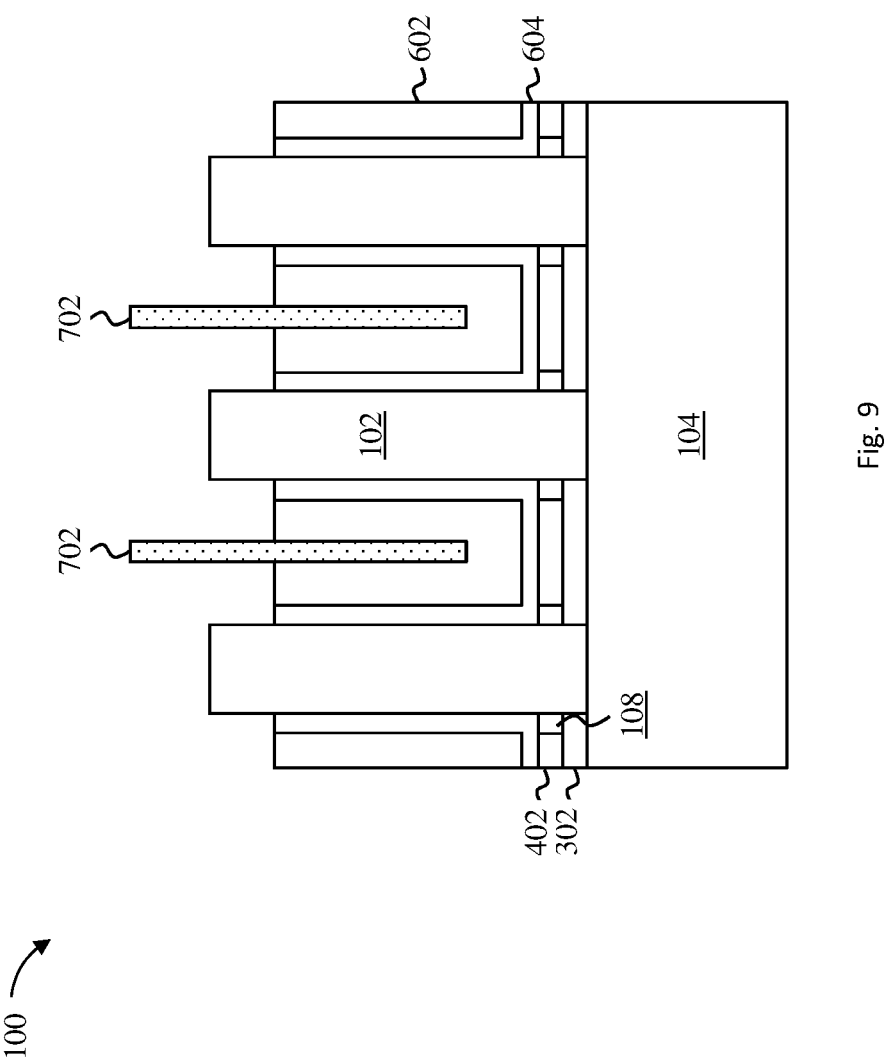
FIG. 9 depicts a cross-sectional view of the semiconductor structure after one or more processing operations according to one or more embodiments of the invention.

FIG. 9 depicts a cross-sectional view of the semiconductor structure 100 during an intermediate operation of a method of fabricating a semiconductor device according to one or more embodiments of the invention. As illustrated in FIG. 9, the gate 602 and the high-k dielectric film 604 can be recessed below a top surface of the semiconductor fins 102. In this manner, a sidewall of the dielectric isolation region 702 can be exposed. The gate 602 and the high-k dielectric film 604 can each be recessed using an etch process, which can be a wet etch process, a dry etch process or a combination thereof. In some embodiments of the invention, the gate 602 and the high-k dielectric film 604 are recessed selective to the semiconductor fins 102 and/or the dielectric isolation region 702.

Figure 10:
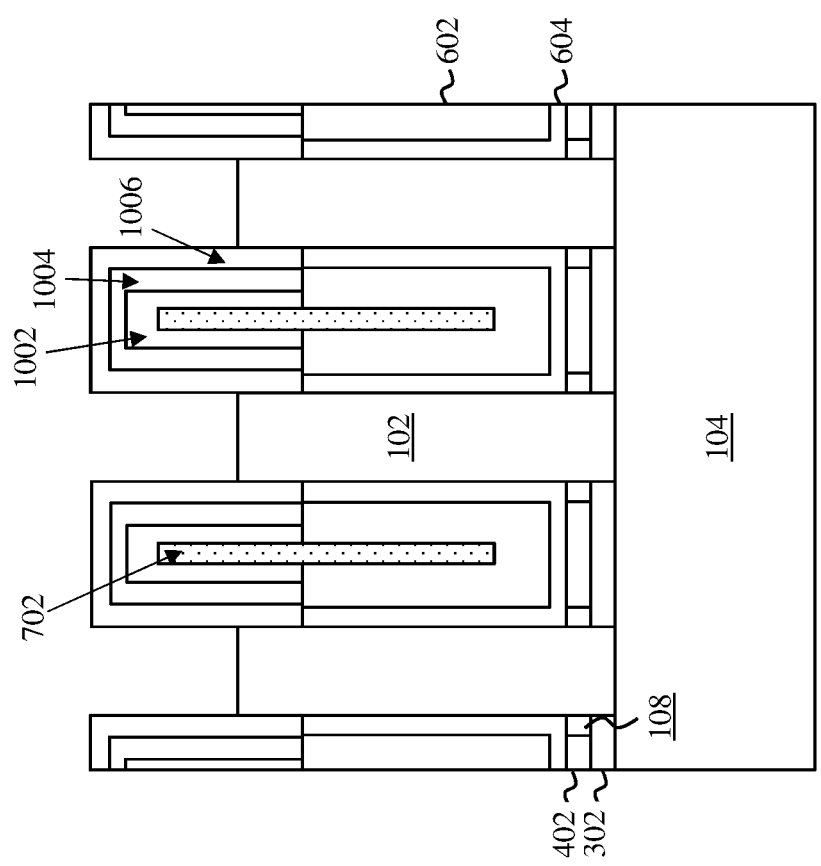
FIG. 10 depicts a cross-sectional view of the semiconductor structure after one or more processing operations according to one or more embodiments of the invention.

FIG. 10 depicts a cross-sectional view of the semiconductor structure 100 during an intermediate operation of a method of fabricating a semiconductor device according to one or more embodiments of the invention. As illustrated in FIG. 10, top spacer material can be cyclically deposited onto the exposed sidewalls and top surface of the dielectric isolation region 702 to form one or more cyclic dielectric layers (e.g., the first cyclic dielectric layer 1002, the second cyclic dielectric layer 1004, and the third cyclic dielectric layer 1006). While depicted in FIG. 10 as having three cyclic dielectric layers 1002, 1004, and 1006 deposited during three cyclic deposition cycles for ease of illustration, it is understood that any number of cyclic dielectric layers, for example, 1, 2, 3, 4, 5, 6, 7, 8, 9, and 10 cyclic dielectric layers, can be formed over the exposed surfaces of the dielectric isolation region 702. The number of cyclic dielectric layers for a given application is a function of the deposition thickness of each of the cyclic dielectric layers as well as the thickness of the divot to be filled. In other words, additional cyclic dielectric layers can be deposited over the exposed dielectric isolation region 702 until the top spacer region (i.e., the volume between adjacent semiconductor fins) is completely filled.

The cyclic dielectric layers 1002, 1004, and 1006 can be formed using an area selective deposition process, such as, for example, area-selective ALD (as-ALD). In some embodiments of the invention, the cyclic dielectric layers 1002, 1004, and 1006 are formed using a known dielectric selective deposition process, during which the deposition of a top spacer dielectric material only occurs (i.e., selectively occurs) on the exposed surfaces of the dielectric isolation region 702 and on exposed surfaces of the previously deposited cyclic dielectric layers. In some embodiments of the invention, non-dielectric portions of the semiconductor structure 100 are dosed with inhibitor molecules during each of the cyclic deposition cycles. In other words, exposed surfaces of the semiconductor fin 102, the gate 602, and the high-k dielectric film 604 can be treated to prevent deposition of the dielectric material. In some embodiments of the invention, the semiconductor device 100 is exposed to a thiol (e.g., alkanethiol) vapor or gas solution, during which the thiol forms self-assembled monolayers (SAM) on the non-dielectric surfaces. The SAMs inhibit dielectric deposition. In some embodiments of the invention, the SAMs inhibit dielectric deposition by blocking precursor adsorption during the dielectric deposition process.

The top spacer dielectric material can be any suitable material, such as, for example, a low-k dielectric, a nitride, silicon nitride, SiON, SiC, SiOCN, or SiBCN. In some embodiments of the invention, the top spacer dielectric material can be doped with dopants (e.g., boron or carbon). In some embodiments of the invention, each of the cyclic dielectric layers 1002, 1004, and 1006 are made of the same material (e.g., SiN). In some embodiments of the invention, the cyclic dielectric layers 1002, 1004, and 1006 are formed using different dielectric materials. For example, the first cyclic dielectric layer 1002 and the third cyclic dielectric layer 1006 can be made of SiN, while the second cyclic dielectric layer 1004 can be made of SiBCN (resulting in, e.g., a SiN/SiBCN/SiN tri-layer). Other combinations can be provided by changing the dielectric material of one or more of the cyclic deposition layers, and all combinations are within the contemplated scope of the aspects of the invention.

In some embodiments of the invention, the cyclic dielectric layers 1002, 1004, and 1006 can be formed using a plasma-assisted ALD with a bis(diethylamino)silane (BDEAS) precursor and oxygen plasma pulses. As discussed previously herein, this area selective cyclic deposition process can be completed as a low temperature process (i.e., at a temperature of less than or equal to about 400 degrees Celsius) that is compatible with the conventional VFET thermal budget. In some embodiments of the invention, the cyclic dielectric layers 1002, 1004, and 1006 can be formed using the plasma-assisted ALD at a substrate temperature of about 150 degrees Celsius and at a pressure of about 10 Torr. In some embodiments of the invention, each of the cyclic deposition layers can be deposited to a thickness of about 0.5 nm to about 4 nm, although other thicknesses are within the contemplated scope of the invention. Advantageously, these relatively thin cyclic dielectric layers can be successively formed over the dielectric isolation region 702 without developing any seems or voids, improving the etch resistance of these layers to downstream processes.

Figure 11:
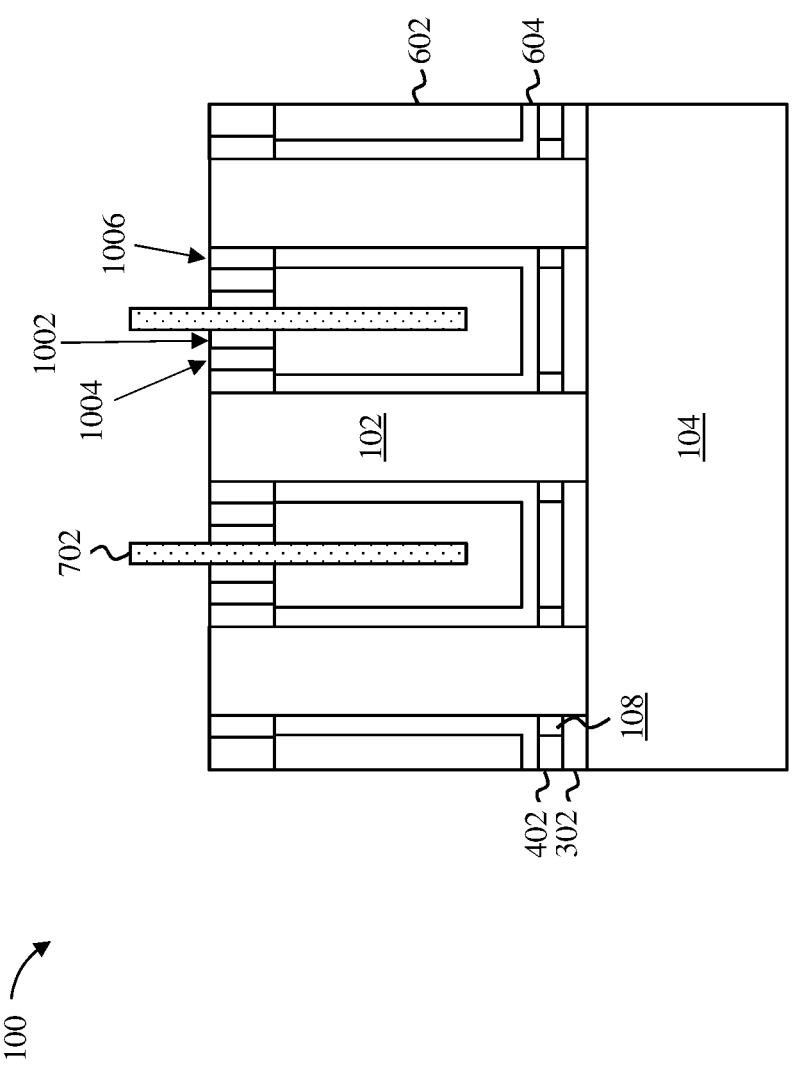
FIG. 11 depicts a cross-sectional view of the semiconductor structure after one or more processing operations according to one or more embodiments of the invention.

FIG. 11 depicts a cross-sectional view of the semiconductor structure 100 during an intermediate operation of a method of fabricating a semiconductor device according to one or more embodiments of the invention. As illustrated in FIG. 11, the cyclic dielectric layers 1002, 1004, and 1006 can be partially removed to the top surface of the semiconductor fins 102 using an isotropic etch back. In some embodiments of the invention, portions of the cyclic dielectric layers 1002, 1004, and 1006 can be removed using a nitride selective etch back, such as a nitride RIE, a wet nitride etch, or a dry chemical nitride etch.

Figure 12:
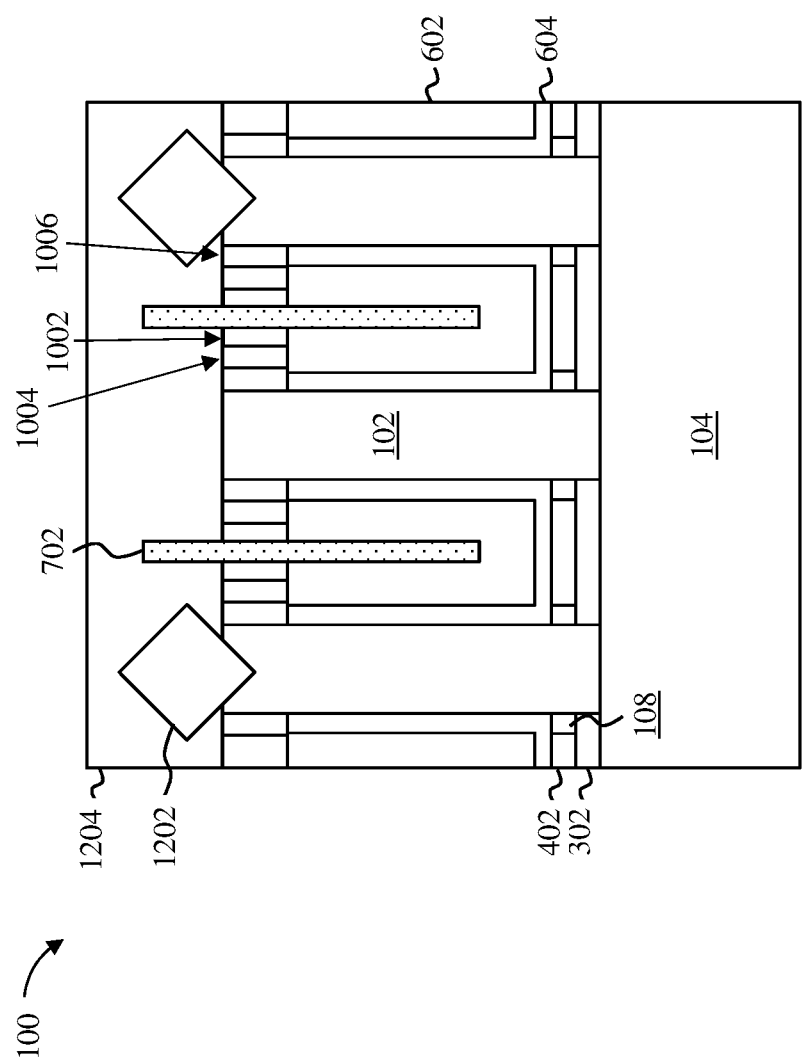
FIG. 12 depicts a cross-sectional view of the semiconductor structure after one or more processing operations according to one or more embodiments of the invention.

FIG. 12 depicts a cross-sectional view of the semiconductor structure 100 during an intermediate operation of a method of fabricating a semiconductor device according to one or more embodiments of the invention. As illustrated in FIG. 12, a top junction source/drain epitaxy 1202 (hereinafter top junction 1202) is formed on a surface of the semiconductor fins 102. In some embodiments of the invention, the top junction 1202 can be epitaxially grown on exposed surfaces of the semiconductor fins 102. In some embodiments of the invention, the top junction 1202 is epitaxially grown to a height of about 4 nm to about 50 nm, for example 10 nm, above the top surface of the semiconductor fin 102, although other heights are within the contemplated scope of the invention. Epitaxial semiconductor materials can be grown using, for example, vapor-phase epitaxy (VPE), molecular beam epitaxy (MBE), liquid-phase epitaxy (LPE), or other suitable processes. The top junction 1202 can include epitaxial semiconductor materials grown from gaseous or liquid precursors.

In some embodiments of the invention, the top junction 1202 can be doped by adding n-type dopants (e.g., phosphorus or arsenic) or p-type dopants (e.g., Ga, B, $BF_2$, or Al). In some embodiments of the invention, the top junction 1202 can be epitaxially formed and doped by a variety of methods, such as, for example, in-situ doped epitaxy (doped during deposition), doped following the epitaxy, or by implantation and plasma doping. The dopant concentration in the doped regions can range from $1\times10^{19}$ $cm^{-3}$ to $2\times10^{21}$ $cm^{-3}$, or between $1\times10^{20}$ $cm^{-3}$ and $1\times10^{21}$ $cm^{-3}$.

In some embodiments of the invention, a contact 1204 is formed over the top junction 102 and the cyclic dielectric layers 1002, 1004, and 1006. The contact 1204 can be formed or deposited using known metallization techniques. In some embodiments of the invention, an interlayer dielectric (not depicted) is patterned with open trenches and a bulk contact material is deposited into the trenches. In some embodiments of the invention, the contacts are overfilled into the trenches, forming overburdens above a surface of the interlayer dielectric. In some embodiments of the invention, a CMP selective to the interlayer dielectric removes the overburden.

The contact 1204 can be made of any suitable conducting material, such as, for example, metal (e.g., tungsten, titanium, tantalum, ruthenium, zirconium, cobalt, copper, aluminum, platinum), conducting metallic compound material (e.g., tantalum nitride, titanium nitride, tantalum carbide, titanium carbide, titanium aluminum carbide, tungsten silicide, tungsten nitride, cobalt silicide, nickel silicide), conductive carbon, or any suitable combination of these materials. In some embodiments of the invention, the contact 1204 is a tungsten contact. The conductive material can further include dopants that are incorporated during or after deposition. In some embodiments of the invention, the contact 1204 can be made of copper and can include a barrier metal liner. The barrier metal liner prevents the copper from diffusing into, or doping, the surrounding materials, which can degrade their properties. Examples include tantalum nitride and tantalum (TaN/Ta), titanium, titanium nitride, cobalt, ruthenium, and manganese.

FIG. 13 depicts a flow diagram 1300 illustrating a method for forming a semiconductor device according to one or more embodiments of the invention. As shown at block 1302, a first semiconductor fin is formed over a substrate. At 1304, a second semiconductor fin is formed over the substrate and adjacent to the first semiconductor fin.

As shown at block 1306, a dielectric isolation region is formed between the first semiconductor fin and the second semiconductor fin. The dielectric isolation region can be formed in a similar manner as the dielectric isolation region 702 depicted in FIG. 7.

At block 1308, a top spacer is formed between the first semiconductor fin and the second semiconductor fin by cyclically depositing dielectric layers over the dielectric isolation region. As discussed previously herein, the dielectric layers are inhibited from depositing on a surface of the first semiconductor fin and on a surface of the second semiconductor fin. In some embodiments of the invention, the top spacer is formed by cyclically depositing top spacer material onto exposed sidewalls and a top surface of the dielectric isolation region. In this manner, one or more cyclic dielectric layers (e.g., the first cyclic dielectric layer 1002, the second cyclic dielectric layer 1004, and the third cyclic dielectric layer 1006 depicted in FIG. 10) can be selectively deposited over the dielectric isolation region.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (e.g., rotated 90 degrees or at other orientations), and the spatially relative descriptors used herein should be interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention, epitaxial growth and/or deposition processes can be selective to forming on semiconductor surface, and may or may not deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (ME), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a semiconductor device, the method comprising:
    forming a first semiconductor fin over a substrate;
    forming a second semiconductor fin over the substrate and adjacent to the first semiconductor fin;
    forming a dielectric isolation region between the first semiconductor fin and the second semiconductor fin; and
    forming a top spacer between the first semiconductor fin and the second semiconductor fin by cyclically depositing dielectric layers over the dielectric isolation region using a plurality of cyclic deposition cycles;
    wherein non-dielectric portions of the semiconductor device are dosed with inhibitor molecules during each cycle of the plurality of cyclic deposition cycles such that the dielectric layers are inhibited from depositing on a surface of the first semiconductor fin and on a surface of the second semiconductor fin.

2. The method of claim 1 further comprising forming a conductive gate over a channel region of the first semiconductor fin and over a channel region of the second semiconductor fin.

3. The method of claim 2 further comprising recessing the conductive gate below a top surface of the first semiconductor fin to expose a surface of the dielectric isolation region.

4. The method of claim 1, wherein cyclically depositing dielectric layers over the dielectric isolation region comprises:
    forming a first cyclic dielectric layer over a surface of the dielectric isolation region;
    forming a second cyclic dielectric layer over the first cyclic dielectric layer; and
    forming a third cyclic dielectric layer over the second cyclic dielectric layer.

5. The method of claim 4, wherein the first cyclic dielectric layer, the second cyclic dielectric layer, and the third cyclic dielectric layer comprise a same dielectric material.

6. The method of claim 4, wherein the first cyclic dielectric layer comprises a first dielectric material and the second cyclic dielectric layer comprises a second dielectric material.

7. The method of claim 6, wherein the first cyclic dielectric layer comprises SiN and the second cyclic dielectric layer comprises SiBCN or SiOCN.

8. The method of claim 1 further comprising planarizing the top spacer to a top surface of the first semiconductor fin.

9. The method of claim 8, wherein planarizing the top spacer comprises applying to the top spacer an isotropic nitride selective etch.

10. A method for forming a semiconductor device, the method comprising:
    forming a first semiconductor fin over a substrate;
    forming a second semiconductor fin over the substrate and adjacent to the first semiconductor fin;
    forming a conductive gate over a channel region of the first semiconductor fin and over a channel region of the second semiconductor fin;
    forming a dielectric isolation region between the first semiconductor fin and the second semiconductor fin, the dielectric isolation region between opposite sidewalls of the conductive gate; and
    selectively depositing a dielectric material on a surface of the dielectric isolation region using a plurality of cyclic deposition cycles, wherein non-dielectric portions of the semiconductor device are dosed with inhibitor molecules during each cycle of the plurality of cyclic deposition cycles.

11. The method of claim 10, wherein the dielectric material is inhibited from depositing on a surface of the first semiconductor fin, a surface of the second semiconductor fin, and a surface of the conductive gate.

12. The method of claim 10 further comprising forming a top source or drain (S/D) region on a surface of the first semiconductor fin.

13. The method of claim 12 further comprising forming a contact over the top S/D region.

14. The method of claim 10 further comprising forming a bottom source or drain (S/D) region on a surface of the substrate, a portion of the bottom S/D region in contact with a sidewall of the first semiconductor fin.

15. The method of claim 14 further comprising forming a bottom spacer on a surface of the bottom S/D region.

* * * * *